United States Patent
Shau

(10) Patent No.: US 6,756,645 B2
(45) Date of Patent: Jun. 29, 2004

(54) EMBEDDED ELECTRICALLY PROGRAMMABLE READ ONLY MEMORY DEVICES

(76) Inventor: Jeng-Jye Shau, 991 Amarillo Ave., Palo Alto, CA (US) 94303

(\*) Notice: Subject to any disclaimer, the term of this patent is extended or adjusted under 35 U.S.C. 154(b) by 0 days.

(21) Appl. No.: 10/127,953

(22) Filed: Apr. 23, 2002

(65) Prior Publication Data

US 2002/0173101 A1 Nov. 21, 2002

Related U.S. Application Data

(62) Division of application No. 09/480,915, filed on Jan. 11, 2000, now Pat. No. 6,377,484.

(51) Int. Cl.[7] ............................................. H01L 29/76
(52) U.S. Cl. ....................................... 257/391; 257/390
(58) Field of Search ................................ 257/390, 391, 257/294, 295, 306, 315, 297, 298, 299, 300, 307, 308, 311, 314, 316, 317, 318, 319, 320, 321, 322, 323

(56) References Cited

U.S. PATENT DOCUMENTS 5,643,816 A \* 7/1997 Hsu et al.
5,723,375 A \* 3/1998 Ma et al.
5,859,453 A \* 1/1999 Ahn
6,011,288 A \* 1/2000 Lin et al.
6,018,475 A \* 1/2000 Papadas et al.
6,377,484 B1 \* 4/2002 Shau \* cited by examiner Primary Examiner—Nathan J. Flynn
Assistant Examiner—Kevin Quinto
(74) Attorney, Agent, or Firm—Bo-In Lin

(57) ABSTRACT

The present invention teaches novel electrically programmable read only memory (EPROM) devices for embedded applications. EPROM devices of the present invention utilize existing circuit elements without complicating existing manufacture technologies. They can be manufactured by dynamic random access memory (DRAM) technologies, standard logic technologies, or any type of IC manufacture technologies. Unlike conventional EPROM devices, these novel devices do not require high voltage circuits to support their programming operation. EPROM devices of the present invention are ideal for embedded applications. Typical applications including the redundancy circuits for DRAM, the programmable firmware for logic products, and the security identification circuits for IC products.

11 Claims, 11 Drawing Sheets

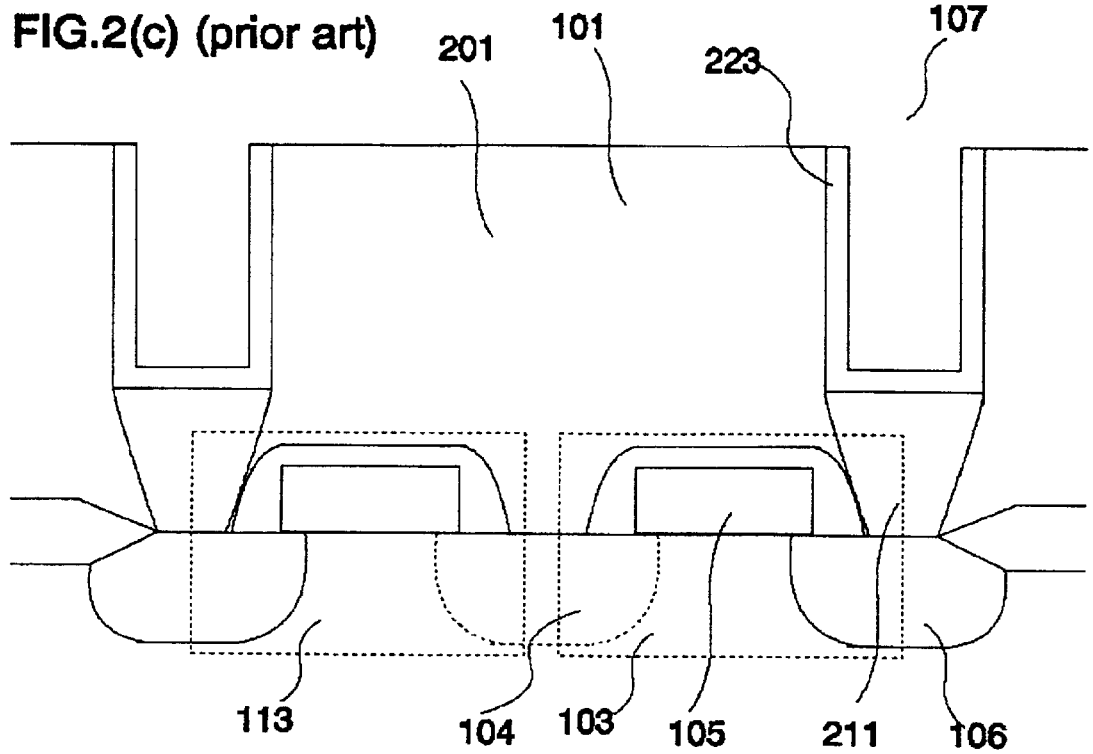
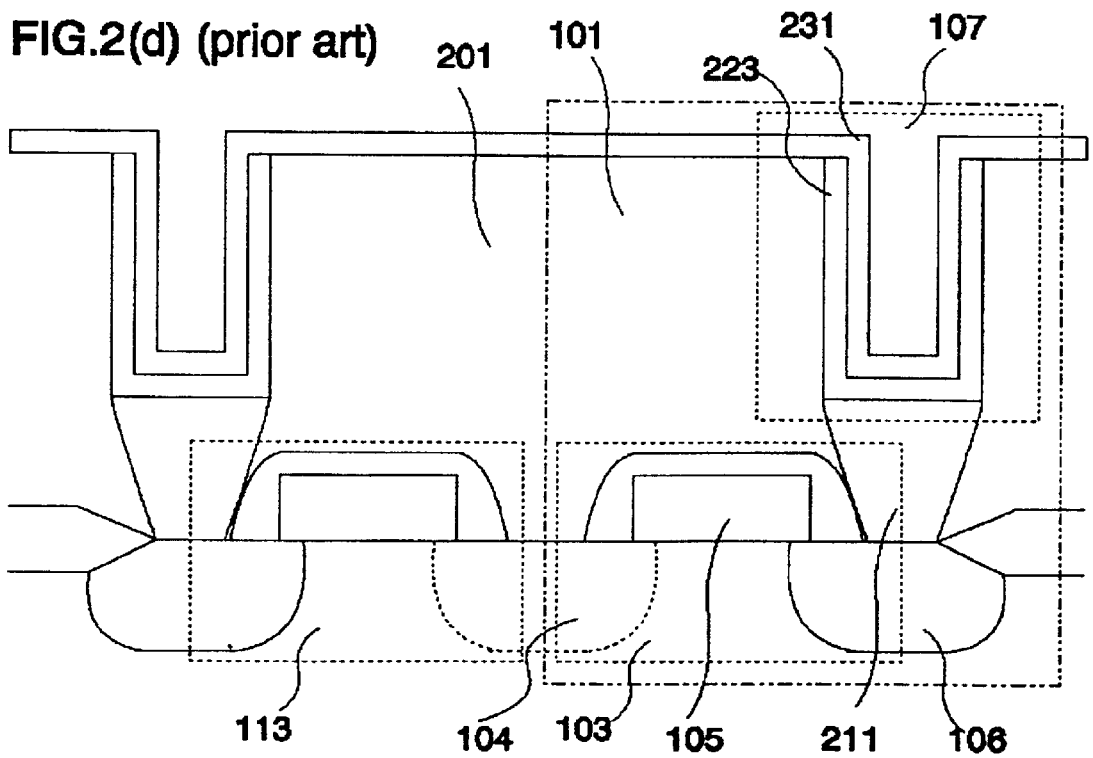

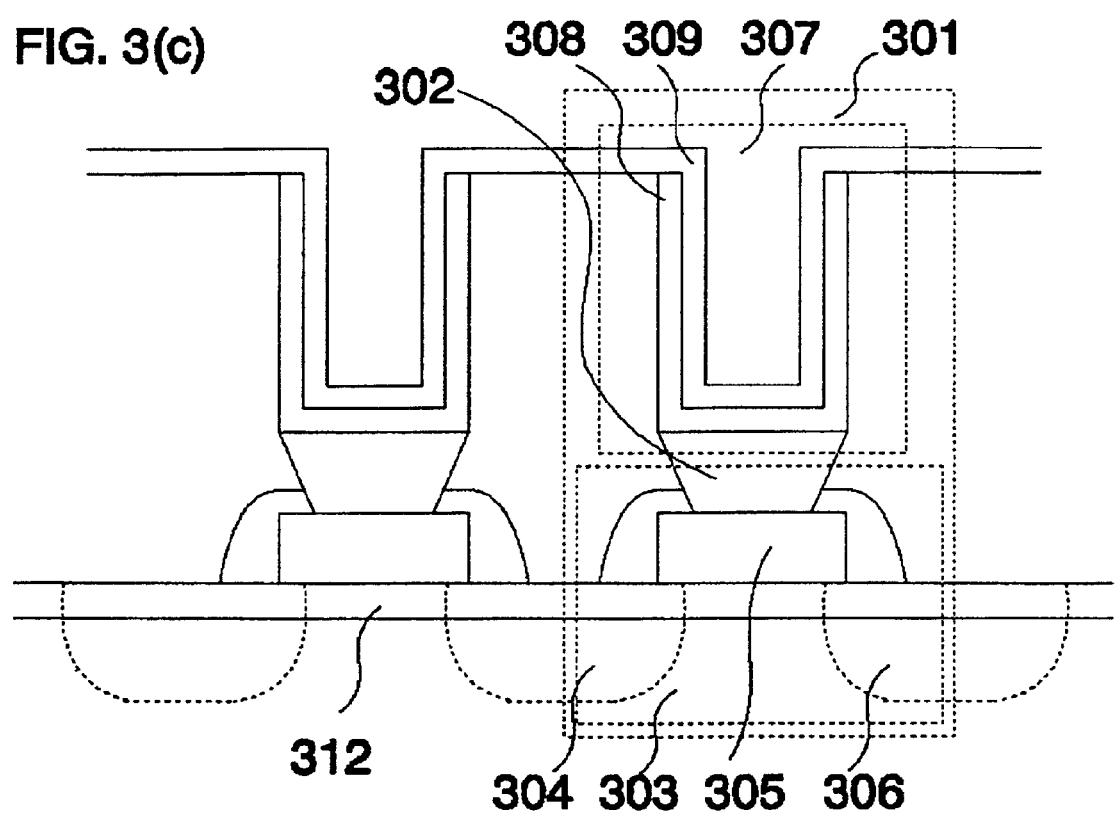

EMBEDDED ELECTRICALLY PROGRAMMABLE READ ONLY MEMORY DEVICES

This Application is a Divisional Application of a patent application Ser. No. 09/480,915 filed by the Applicant of this invention on Jan. 11, 2000, now U.S. Pat. No. 6,377,484.

BACKGROUND OF THE INVENTION

The present invention relates to electrically programmable read only memory (EPROM) device, and more particularly to embedded EPROM devices manufactured by existing integrated circuit (IC) technologies.

Current art EPROM devices are manufactured by special technologies that are optimized only for stand-along EPROM products. It is not practical to put other types of integrated circuits, such as DRAM or high performance logic circuits, on the same wafer with current art EPROM devices. On the other hand, it is strongly desirable to have programmable devices for DRAM or logic circuits. DRAM devices are typically high density devices; each individual DRAM device contains millions or even billions of memory cells. It is very difficult to manufacture such a large device without any local failures. DRAM devices are therefore equipped with programmable redundancy circuits. The redundancy circuits repair partial failures on individual devices. Such redundancy circuits improve DRAM yield dramatically and therefore reduce the cost of DRAM products significantly. The redundancy circuits must be programmable to fix failures at different locations. Ideally, we would like to program those redundancy circuits using EPROM. When the device can be programmed electrically, the required testing costs can be reduced significantly. The problem is that no current art EPROM devices can be manufactured using current art DRAM manufacture technologies. Current art DRAM redundancy circuits usually use fuses to support its programmable functions. Those fuses occupy relatively large areas. Sophisticated wafer level testing equipment equipped with LASER is required to burn those fuses in order to configure the redundant circuits. The process is destructive and cumbersome. It is therefore strongly desirable to use EPROM devices, instead of fuses, to support DRAM redundancy circuits.

Besides redundancy circuits, EPROM devices are very useful for other applications. For example, we can implement programmable firmware on logic circuits so that the same product can be programmed to support different applications. Each individual product can have its own identification (ID) number for security purpose if it is equipped with EPROM devices. The problem is, again, current art EPROM devices can not be manufactured by standard logic technologies. Currently, special embedded EPROM technologies are available to build conventional EPROM devices and logic circuits on the same wafer. Such special technologies require many more manufacturing steps than standard logic technologies so that the cost is significantly higher. Another major problem is that conventional EPROM devices require high voltages to support programming and erase operations. The requirement for high voltages further complicates the manufacture technology. It is therefore strongly desirable to have EPROM devices that can be manufactured by standard logic technologies.

SUMMARY OF THE INVENTION

The primary objective of this invention is, therefore, to providing practical methods to build embedded EPROM devices using existing IC manufacture technologies. One objective of the present invention is to provide EPROM device for DRAM redundancy circuits using existing DRAM technology. Another objective of the present invention is to provide EPROM devices manufactured by standard logic technologies. It is also desirable that such devices do not require high voltages for its operations.

These and other objectives are accomplished by novel device structures that utilize existing circuit elements to build EPROM devices without complicating existing manufacture technologies. For example, DRAM storage capacitors are used as the coupling capacitors to build floating gate EPROM devices. Another example is to utilize transistor properties changed under stress conditions to support EPROM operations.

While the novel features of the invention are set forth with particularly in the appended claims, the invention, both as to organization and content, will be better understood and appreciated, along with other objects and features thereof, from the following detailed descriptions taken in conjunction with the drawings.

DETAILED DESCRIPTION OF THE INVENTION

Figure 1:
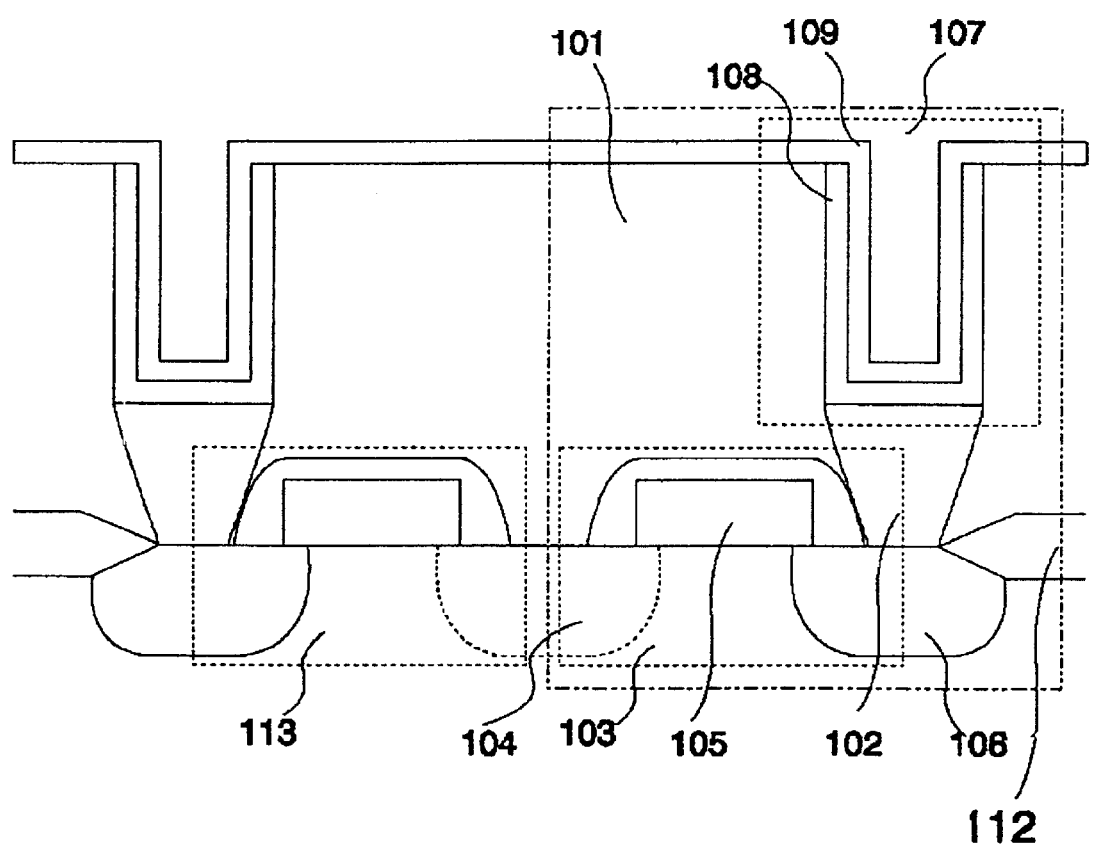
FIG. 1 is the cross section diagram for a current art DRAM memory cell.

The physical structure of a DRAM memory device is illustrated by the simplified cross-section diagram in FIG. 1. Each DRAM memory cell (101) contains one select transistor (103) and one storage capacitor (107). The gate (105) of the select transistor is connected to memory word line (WL). This gate (105) is typically made of polycrystalline silicon (poly) thin film. The gate is separated from the substrate by a thin film gate oxide, but the gate oxide is too thin to be shown in the diagram. The source (106) of the select transistor is connected to the bottom electrode (108) of the storage capacitor (107). This storage capacitor (107) contains two electrodes. The top electrode (109) is usually called the "plate" electrode in current art DRAM technology. The plate is usually shared by a plural of memory cells, and it is usually connected to a stable voltage source. The bottom electrode (108) of the storage capacitor (107) is unique for each memory cell, and it is used to store data. There is a thin insulating layer between the two electrodes of the storage capacitor, which is too thin to be shown in our figures. A contact plug (102) is usually used to connect the bottom electrode (108) of the storage capacitor to the source (106) of the select transistor, which is separated from the source of nearby transistor (not shown) by filed oxide (112). The drain (104) of the select transistor is connected to the memory bit line (not shown). To reduce bit line loading, the drain (104) electrode is typically shared by the select transistor (113) of a nearby memory cell. In FIG. 1, this drain (104) area is represented by dashed lines because it is usually not on the same cross-section plan as the storage capacitor (107).

Figure 2A:
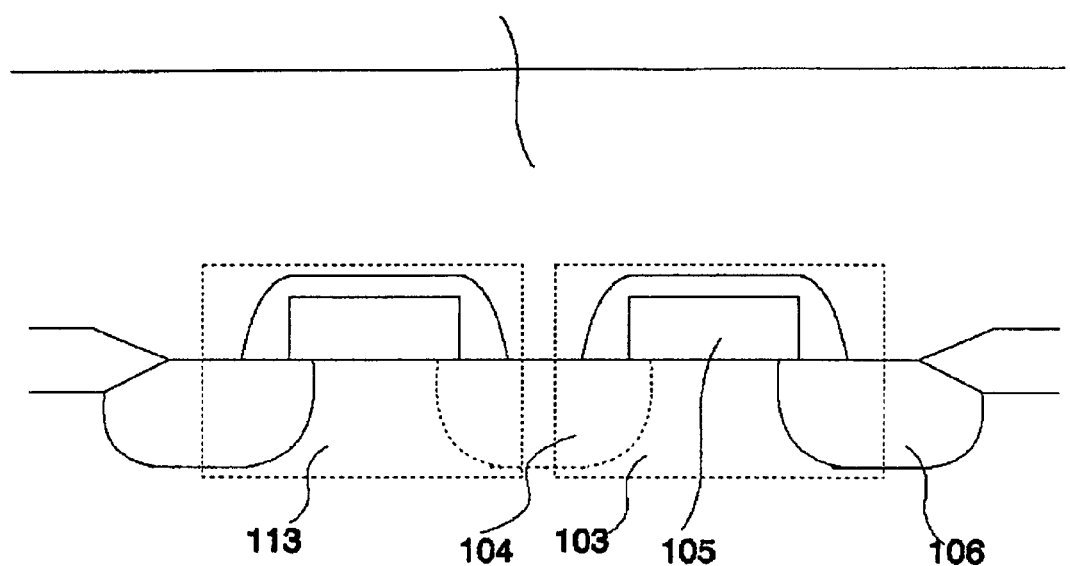
FIGS. 2(a–d) are cross section diagrams illustrating the manufacture procedures for current art DRAM.
Figure 2B:
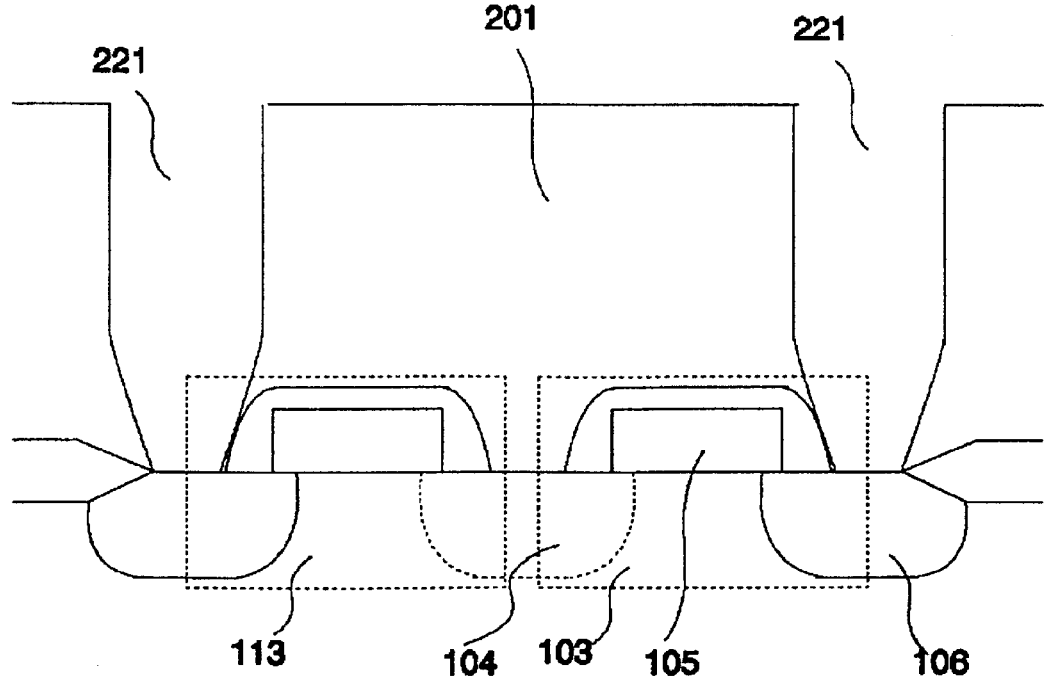

The manufacture procedures for the DRAM storage capacitor (107) are illustrated by the simplified cross-section diagrams in FIGS. 2(a–d). FIG. 2(a) shows the structure just before the beginning of the storage capacitor manufacture procedures. At this time, the select transistor (103) is fully manufactured, while the location for the storage capacitor is covered with insulator layers (201). The next step is to dig a deep DRAM contact hole (221) through the insulator (201) to the silicon substrate at the source (106) of the select transistor (103), as illustrated by the cross section diagram in FIG. 2(b). Plasma etching is usually needed for this manufacture step. Typically, a plug (211) is placed into the bottom of the contact hole (221) before the bottom electrode (223) of the storage capacitor is formed around the contact hole (221) as illustrated by FIG. 2(c). The top electrode (231) of the storage capacitor and the insulator between those two electrodes are formed in the contact hole (221) by a series of complex manufacture procedures, and the resulting structures are illustrated in FIG. 2(d). The storage capacitor manufacture processes are very complex, and they can be different for technologies developed by different companies. For example, the contact plugs (211) usually are manufactured by separated processing steps. We do not intend to cover details of those manufacture procedures because the present invention is not dependent on such manufacture details.

Figure 3A:
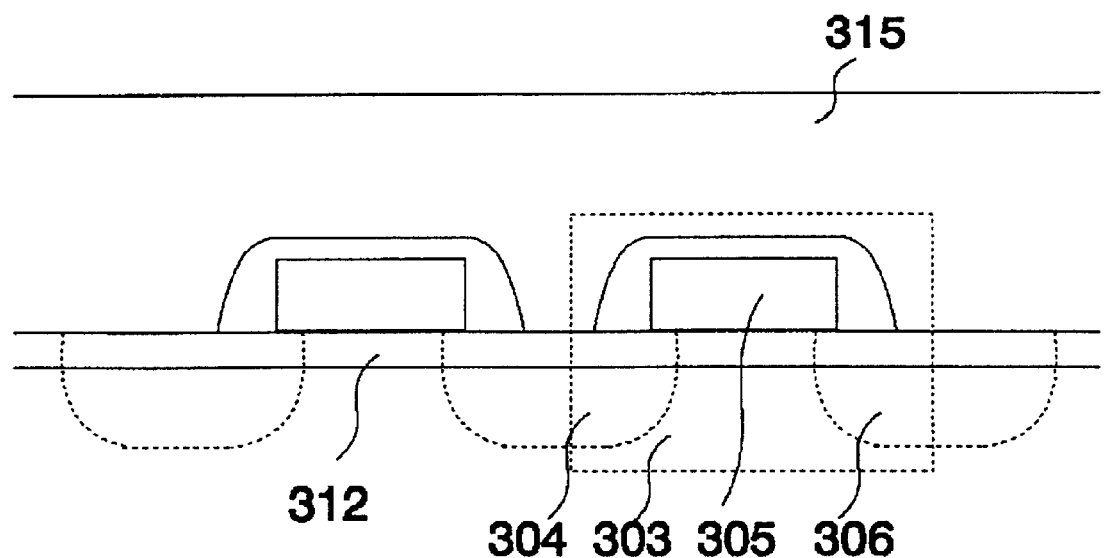
FIGS. 3(a–c) are cross section diagrams illustrating the manufacture procedures for an EPROM device of the present invention.
Figure 3B:
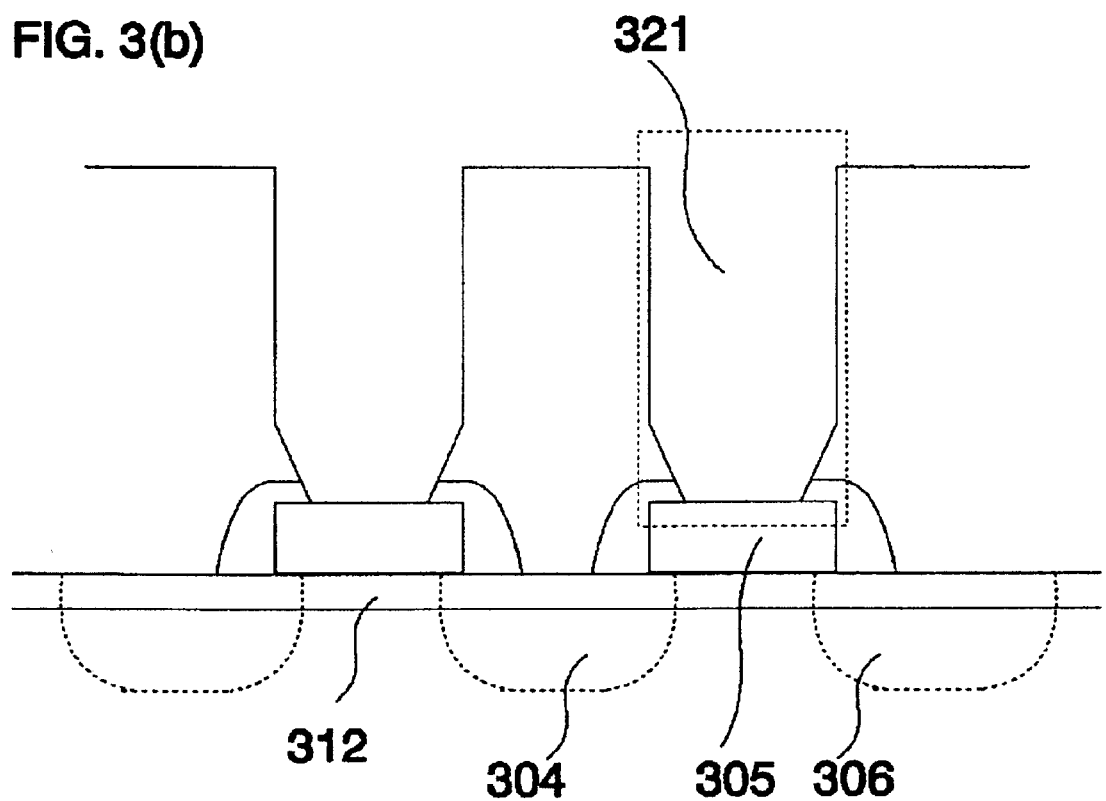

The manufacture procedures for an EPROM memory cell of the present invention are illustrated by the cross section diagrams in FIGS. 3(a–c). FIG. 2(a) shows the structure just before the beginning of the EPROM coupling capacitor is manufactured. At this time, the EPROM transistor (303) is fully manufactured, and its structure is very similar to the structure shown in FIG. 2(a) except that the cross-section is taken away from the transistor at a nearby field oxide layer (312). The source (306) and drain (304) of the EPROM transistor (303) are represented by dashed lines because they are typically not on the same cross-section plan as the couple capacitor. The area on tope of those transistors is covered with insulator layers (315). The gate (305) of this EPROM transistor (303) is not connected to a word line; it is isolated from other EPROM memory cells to be served as the floating gate of the EPROM memory cell. The next step is to dig an EPROM contact hole (321) as illustrated by FIG. 3(b). The EPROM contact holes (321) and the DRAM contact holes (211) are manufactured simultaneously with identical manufacture procedures. The difference is that an EPROM contact hole (321) is placed on top of the poly gate (305) electrode instead of the source (306) of the EPROM select transistor (303). The physical structure of an EPROM contact hole (321) is nearly identical to a DRAM contact hole (221). The floating gate (305) is made of polycrystalline silicon thin film that is of similar etching rate as the silicon substrate at the source (106) of a DRAM select transistor (103). It is therefore possible to manufactured both the DRAM contact holes (221) and the EPROM contact holes (321) simultaneously while using identical etching procedures. After the EPROM contact holes (321) are opened, coupling capacitors (307) that has nearly identical structures as the DRAM storage capacitors (107) are manufactured at the locations of EPROM contact holes (321). The EPROM coupling capacitors (307) and the DRAM storage capacitors (107) are manufactured with identical procedures simultaneously.

The cross section diagram in FIG. 2(c) illustrated the final structures of a DRAM based EPROM (301) memory cell of the present invention. The top electrode (309) of the coupling capacitor (307) serves as the control gate (CG) of the EPROM memory cell. This control gate is manufactured with identical procedures and identical materials as the plate electrode (109) of the DRAM memory cell. The bottom electrode (308) of the coupling capacitor (307) is connected to the gate (305) of the EPROM select transistor (303), and serves as the floating gate (FG) of the EPROM memory cell (301). The drain (304) of the EPROM transistor (303) is connected to ERPROM bit lines (EBL).

Figure 4A:
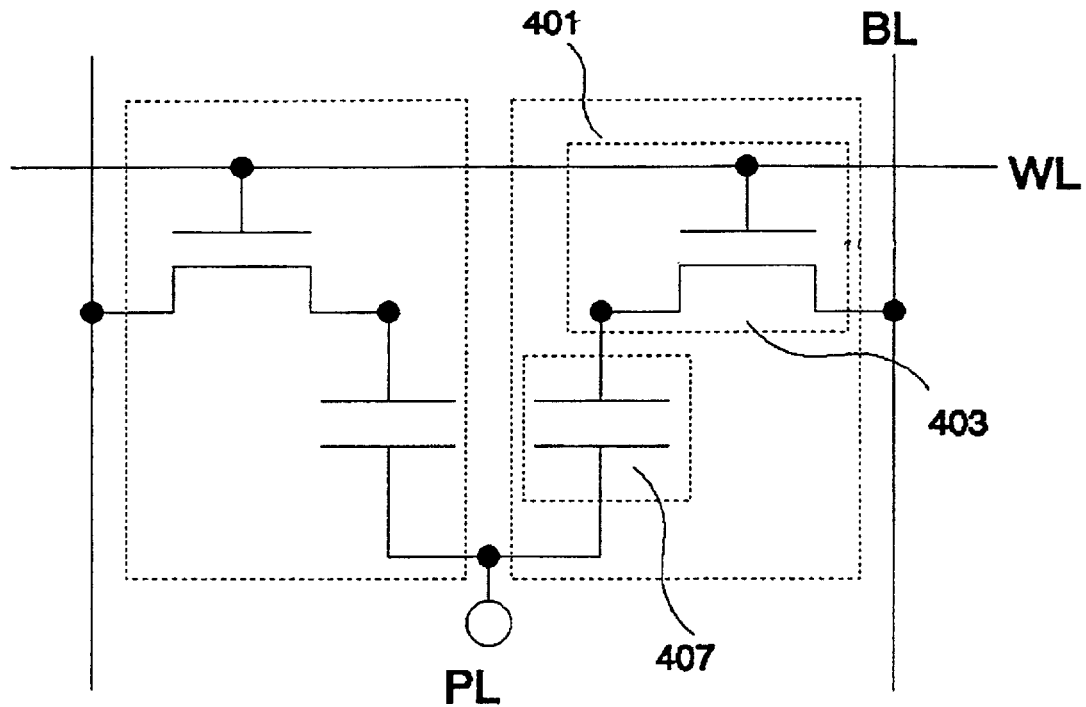
FIG. 4(a) is the schematic diagram for the DRAM memory cells in FIG. 1.
Figure 4B:
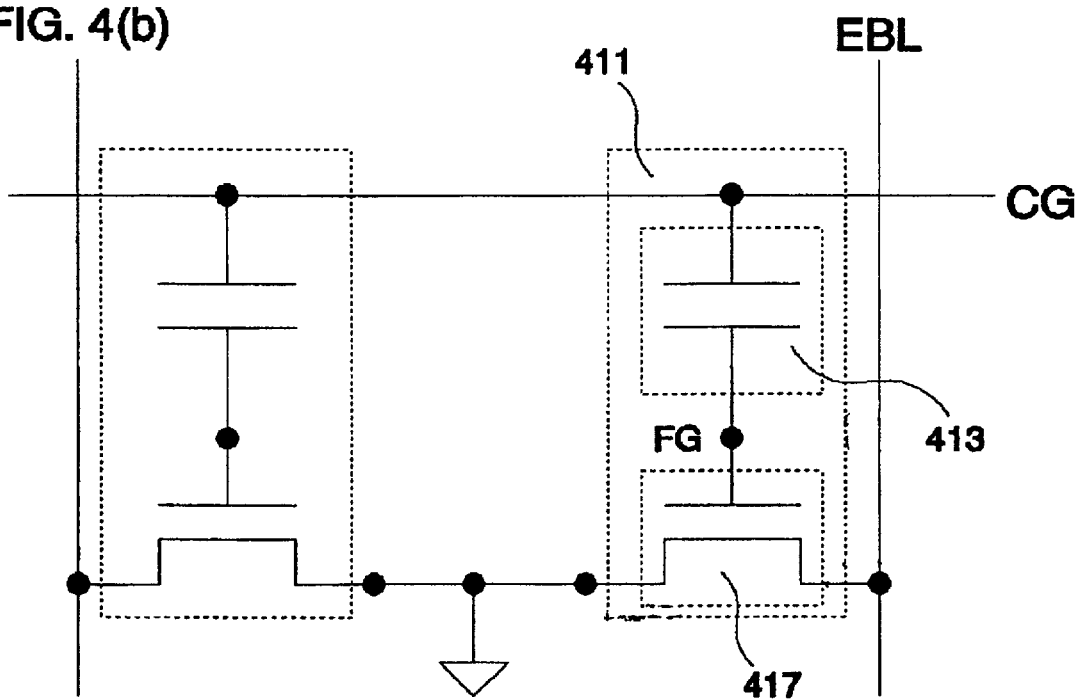
FIG. 4(b) is the schematic diagram for the EPROM memory cells in FIG. 3(c).

FIGS. 4(a, b) are schematic diagrams showing the connections of the above DRAM and EPROM devices. Each DRAM memory cell (401) contains one select transistor (403) and one storage capacitor (407) as shown in FIG. 4(a). The gate of the select transistor (403) is connected to word line (WL), its drain is connected to bit line (BL), and its source is connected to one terminal of its storage capacitor; the other terminal of the storage capacitor is connected to the plate electrode (PL). Each EPROM memory cell (411) contains one transistor (413) and one coupling capacitor (417). The drain of the EPROM transistor is connected to bit line (EBL), its source is connected to ground, and its gate is a floating gate (FG) connected to one electrode of the coupling capacitor; the other terminal of the coupling capacitor is connected to the control gate (CG). For an EPROM device of the present invention, the EPROM coupling capacitor (417) is manufactured in the same way as the DRAM storage capacitor (407). For most cases, the EPROM transistor (413) is also manufactured in the same way as the DRAM select transistor (403). It is therefore possible to have both DRAM and EPROM devices on the same wafer without adding cost to the manufacture procedures.

The operation principles of the above EPROM memory cell of the present invention are the same as that of prior art EPROM memory cells. During a programming operation, the source (306) of the EPROM transistor (303) is connected to ground, the control gate (CG) is connected to a first voltage, and the drain (304) is connected to a second voltage. Electrons are injected into the floating gate (FG) of the EPROM cell by hot electron injection mechanism. Another method to program the EPROM cell is to apply a high positive voltage to the control gate (CG) so that electrons are injected into the floating gate (FG) by tunneling mechanism. To erase the EPROM cell, a high positive voltage is applied on the drain (304) and/or the source (306) of the EPROM transistor (303) while the control gate (CG) is connected to ground. Electrons are pulled out of the floating gate (FG) by tunneling mechanism during such erase operation. Another way to erase the cell is to apply ultra violet (UV) light to the EPROM memory cells so that electrons can leak out of the floating gate (FG). During a read operation, a voltage is applied on the control gate (CG), and the source (306) is connected to ground. External sense amplifiers (not shown) detects the current flowing out of the drain (304) into the EPROM bit line (EBL) to determine the data stored in the EPROM cell.

While specific embodiments of the invention have been illustrated and described herein, it is realized that other modifications and changes will occur to those skilled in the art. It should be understood that the above particular examples are for demonstration only and are not intended as limitation on the present invention. Near every semiconductor manufacturer has specific methods in building the storage capacitors for DRAM memory cells. Key element of the above EPROM device of the present invention is to use DRAM storage capacitor as the coupling capacitor of EPROM memory cell. An EPROM device of the present invention utilizes the same manufacture procedures as the DRAM manufacturing procedures. Therefore, its detailed structures will vary as the details for the DRAM memory cell vary while the functions of the EPROM devices of the present invention are independent of those detailed variations. The scope of the present invention should not be limited by detailed structures of its coupling capacitors. Other modifications to the structures of the EPROM devices of the present invention will also become obvious upon disclosure of the present invention.

The above EPROM devices of the present invention have the following advantages:

The major advantage is the capability to manufacture EPROM devices using existing DRAM manufacture technologies. It is therefore possible to have EPROM memory devices and DRAM memory devices on the same wafer without introducing additional manufacture cost.

The coupling capacitors (417) of the EPROM devices of the present invention are by far larger than those of current art EPROM memory devices.

Since the capacitance of a DRAM storage capacitor is typically more than 20 times higher than the capacitance of a transistor of equivalent area, the gate coupling ratio (GCR) of an EPROM device of the present invention is almost always higher than 0.95. The GCR for a current art EPROM device is typically around 0.5. That means the operation voltages needed to support the EPROM devices of the present invention can be reduced by nearly 50%. The programming and erase voltages requires to support EPROM devices of the present invention is therefore by far lower than that of current art EPROM memory devices. Lowering the supporting voltages dramatically simplifies the requirements on supporting circuits.

The most obvious application of the present invention is to build programmable redundancy circuits on DRAM devices. Current art DRAM devices use fuses to program its on chip redundancy circuits. That repair mechanism is destructive, and the fuses occupy large areas. The programming method also requires sophisticated wafer level tester that increases testing costs. When a repair circuit uses EPROM devices of the present invention, it can be reprogrammed multiple times using simple electrical procedures. The repair also can be done in the field in case a device is damaged after installation. The repair circuits will have much smaller area while operating at much higher performance.

Comparing to current art EPROM devices, one potential disadvantage of the above EPROM devices of the present invention is the durability of the gate oxide. Current art EPROM devices use special treatments on the gate oxide so that they can tolerate more than 100,000 program-erase (PE) cycles. When the EPROM devices of the present invention uses the same gate oxide as DRAM transistors, the gate oxide may not be able to tolerate such a large number of PE cycles. That is usually not a problem because most applications do not require many PE cycles. For applications that require high PE cycles, we need to use the gate oxide for conventional EPROM while we still can use DRAM storage capacitor as the EPROM gate coupling capacitor. In this way, we need to pay additional complexity in manufacturing two types of gate oxides. The resulting increase in price is still by far less than the condition to make DRAM and EPROM separately.

Figure 5:
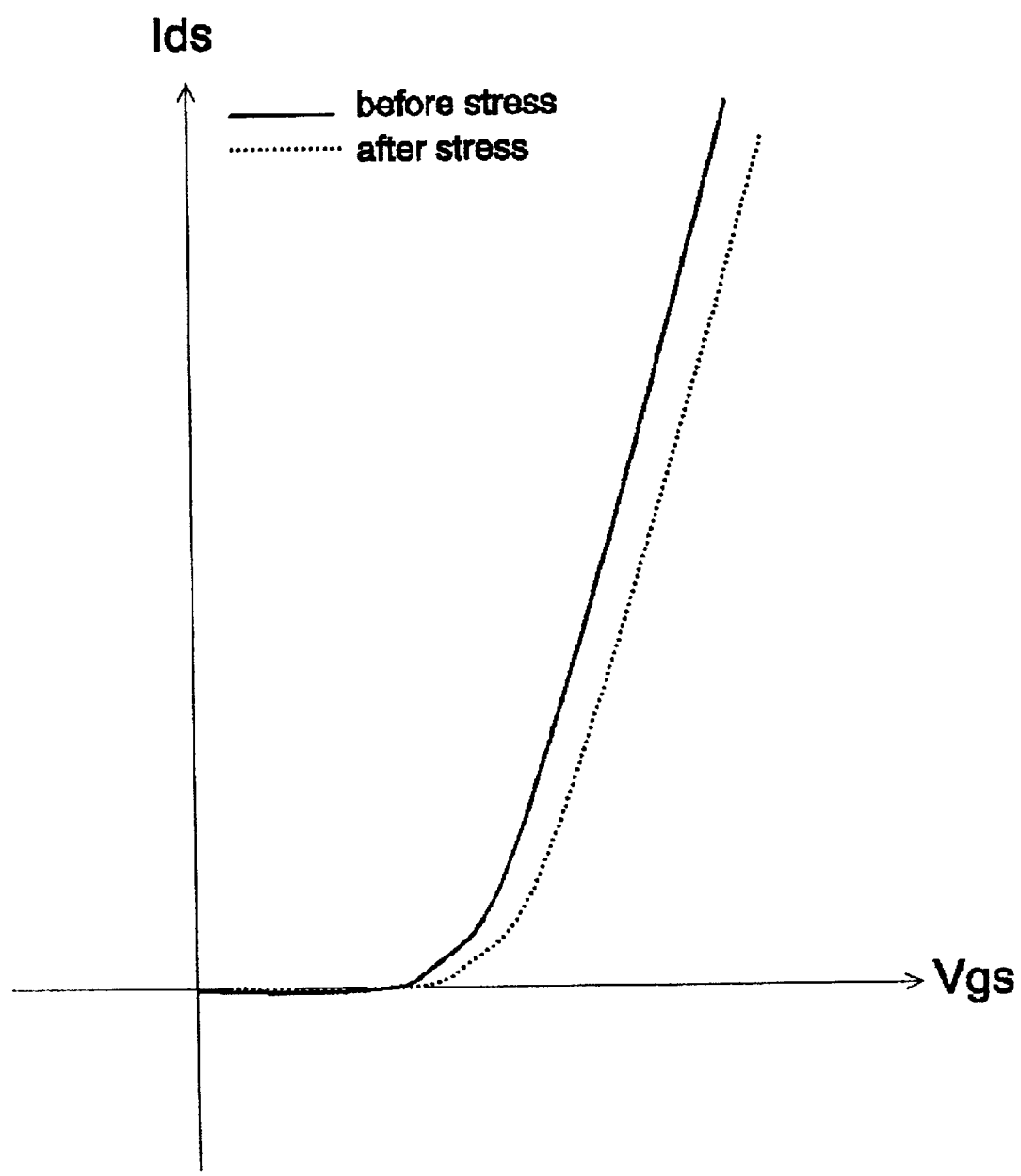
FIG. 5 shows the current-voltage (I-V) relationship for a metal-oxide-siliconn (MOS) transistor before and after hot electron stress.

Current art EPROM devices and the above EPROM devices of the present invention store data by putting electrical charges into floating gates (FG). Another way to build embedded EPROM device using existing manufacture technologies is to build EPROM devices without using floating gate devices. Such EPROM devices of the present invention use the damages caused by electrical stresses on common transistors. By comparing the electrical properties of transistors with different levels of damages, we are able to build novel EPROM devices that are extremely convenient for embedded applications.

for example, we can utilize the hot carrier effects to build EPROM devices using common transistors. When an MOS transistor is operating at high drain-to-source voltage (Vds) while the gate-to-source voltage (Vgs) is slightly higher than its threshold voltage (Vt), there is a strong electrical field build up near its drain area. Such operation conditions are called "hot carrier stress" conditions. Under this stress condition, high energy electrons or holes (called hot carriers) generated by the strong electrical field cause damages to the transistor. The damages, called hot carrier effects, cause changes in transistor electrical properties. Typically, the threshold voltage (Vt) of an n-channel transistor increases after it is damaged by hot carrier effect as illustrated in FIG. 5. The drain to source current under the same bias voltages is also lower after hot carrier damages. On the other words, the current driving capability of n-channel transistors decrease by hot carrier effects. P-channel transistors usually behave in the opposite way; their current driving capabilities increase after hot carrier stress.

The damaging rate of hot carrier effect is significant only when the transistor is under hot carrier stress conditions. At other conditions the hot carrier damage rate is negligible. For example, when Vgs is much higher than Vt or when Vgs is lower than Vt, the transistor won't have a high electrical field near its drain so that there would be no hot carrier damage. Similarly, when Vds is small, the hot carrier effect is negligible. The knowledge allow us to operate a transistor under conditions that will not cause hot carrier damages.

Another type of well-known transistor damage is the gate voltage (Vg) stress damage. Put a high voltage on the gate of a transistor, and permanent damages can be done to the transistor. For most n-channel transistors, Vg stress results in reduced current driving capability.

The hot carrier effect and the Vg stress effect are well-known to the IC industry. They are usually major limiting factors for the development of new IC technologies. Special cares are taken to improve the tolerance in those effects. Special structures such as the lightly doped drain (LDD) structures are implemented to improve tolerances in hot carrier effects. These effects are therefore always fully studied and well-documented for all IC technologies.

The hot carrier damages and Vg stress damages are permanent. Once a transistor is damaged, the effects remain for its lifetime. Under certain conditions (for example, thermal annealing) a damaged transistor can partially recover, but the damages can never fully recover. It is therefore possible to use these effects to store data and to build EPROM devices using common transistors. These types of EPROM devices of the present invention are named "stress effect programmable read only memory" (SEPROM) devices by the present inventor.

Other types of active devices, such as bipolar transistors or diodes, also experience changes in properties after different types of electrical stresses. We can build SEPROM devices using bipolar transistors or diodes as building blocks following the same principles.

Figure 6A:
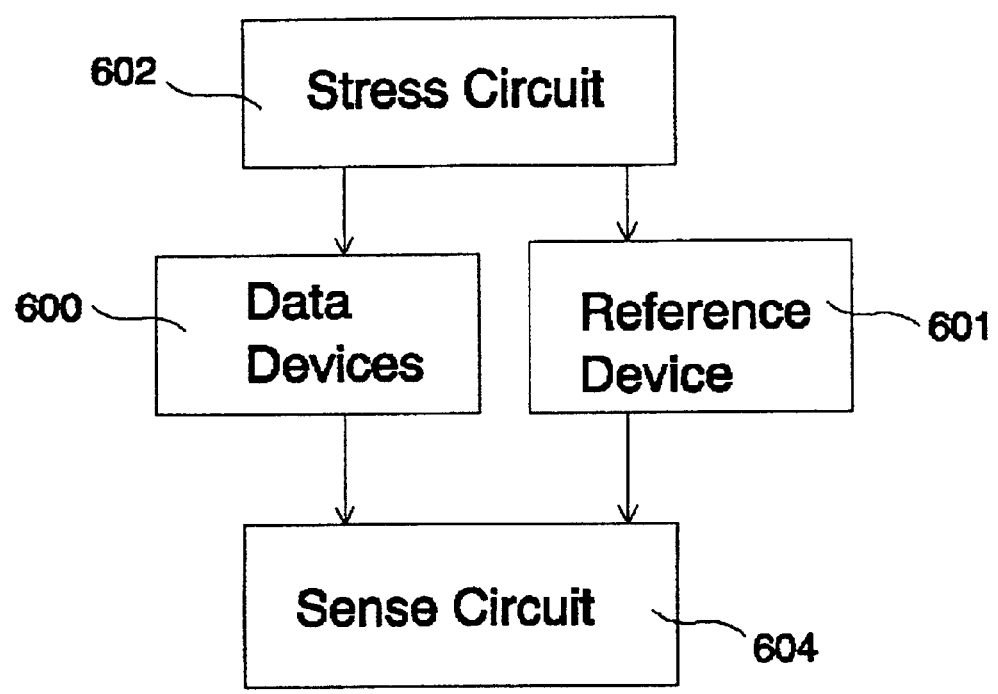
FIGS. 6(a–d) are the symbolic block diagram of the supporting circuit for stress EPROM devices of the present invention.

FIG. 6(a) is a symbolic block diagram illustrating the general operations of SEPROM devices. A stress circuit (602) applies proper electrical stresses to one or more data devices (600) and a reference device (601). Data are represented by the property differences between the data devices and the reference device. Sometimes the reference device can be another data device. A sense circuit (604) senses the differences in device properties between them in order to read the data.

Figure 6B:
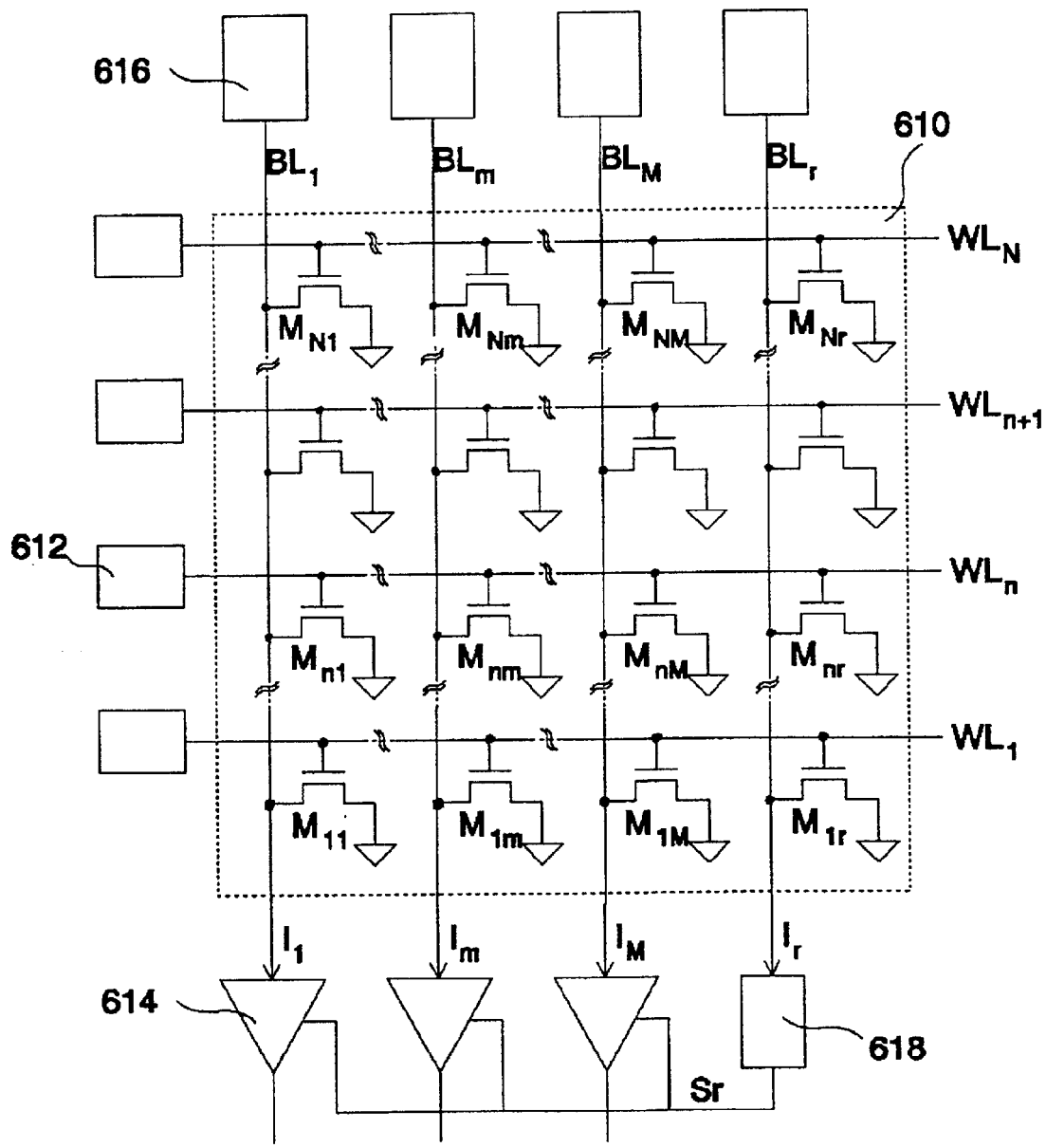

FIG. 6(b) shows the schematic diagram for one practical example of a SEPROM device. A SEPROM memory block (610) comprises a two dimensional (M by N) array of transistors. At the n'th row of the memory block, the gates for data transistors ($M_{n1}, \ldots, M_{nm}, \ldots, M_{nM}$), and the gate for a reference transistor ($M_{nr}$) are connected together to a word line ($WL_n$) as shown in FIG. 6(b). At the m'th column of the memory block, the drains for transistors $M_{1m}, \ldots, M_{nm}, \ldots, M_{Nm}$ are connected together to a bit line ($BL_m$). The drains for reference transistors $M_{1r}, \ldots, M_{nr}, \ldots, M_{Nr}$ are connected together to the reference bit line ($BL_r$). The sources of all those transistors are connected to ground. Each word line ($WL_n$) is connected to the output of a word line decoder (612). Each bit line ($BL_m$) is connected to the input of a bit line sensor (614) and the output of a bit line stress circuit (616). The reference bit line ($BL_r$) is connected to a reference signal generator (618) that generates a reference signal (Sr) to bit line sensors (614).

During a write operation (also called "programming" operation in current art), one of the word line decoder (612) pulls the voltage on the selected word line ($WL_n$) to a voltage optimized for maximum stress rate (Vgst). All the other word lines remain at low voltages. The bit line stress circuits (616) provide bit line stress voltages to the bit lines ($BL_m$) according to the data values to be written to each transistor ($M_{n1}, \ldots, M_{nm}, \ldots M_{nM}, M_{nr}$) on the selected row; to store a digital data '1', the corresponding bit line voltage should be high, and the corresponding selected transistor will experience hot carrier stress; to store a digital data '0', the corresponding bit line voltage should be zero, and the corresponding selected transistor will not be stressed; the reference bit line voltage usually remains low. The digital data certainly can be stored in opposite ways. Hot carrier effect damages transistors when the transistors are (1) on the selected word line and (2) on a bit line that is pulled high. In this way, data can be written into the memory block selectively. The selected word line voltage Vgst, should be controlled to have maximum hot carrier damage rate.

During a read operation, one of the word line decoder (612) pulls the voltage on the selected word line ($WL_n$) to a high voltage. All the other word lines remain at zero. The voltage on the selected word line ($WL_n$) during a read operation should be high enough and the voltage on the bit lines should be low enough that the selected transistors ($M_{n1}, \ldots, M_{nm}, \ldots, M_{nM}, M_{nr}$) will not experience hot carrier effects during this operation. All the bit line stress circuits (616) should be off during this read operation. Each selected transistor ($M_{n1}, \ldots, M_{nm}, \ldots, M_{nM}, M_{nr}$) drives a current $I_{n1}, \ldots, I_{nm}, \ldots, I_{nM}, I_{nr}$) through its corresponding bit line to corresponding bit line sensors (614); for a transistor that has been stressed in previous write operation, its bit line current should be smaller than the reference current ($I_{nr}$); for a transistor that has not been stressed in previous write operation, its bit line current should be about the same as or larger than the reference current ($I_{nr}$). The bit line sensor circuits (614) sense the amplitudes of those bit line currents to determine corresponding data values. If p-channel transistors, instead of n-channel transistors, are used in the memory block (610), then current differences may behave in opposite ways.

It is a common practice to execute a read operation after a write operation in order to make sure correct data pattern has been written properly. Multiple write/read operations maybe necessary to assure correct data are written. During an erase operation, one of the word line decoder (612) pulls the voltage on the selected word line ($WL_n$) to a voltage optimized for maximum stress rate (Vgst). All the other word lines remain at zero. The bit line stress circuits (616) should drive zero to all bit lines except to the reference bit line. The reference bit line voltage should be high so that the selected reference transistor ($M_{nr}$) is under hot carrier stress. The reference transistor should be stressed as hard as all the other stressed transistors on the same word line so that new data can be written into the data transistors by another write operation. It is usually necessary to do a read operation following an erase operation in order to make sure enough stress has been done to the reference transistor. Multiple erase/read operations maybe necessary to assure the erase operation is properly done.

Figure 6C:
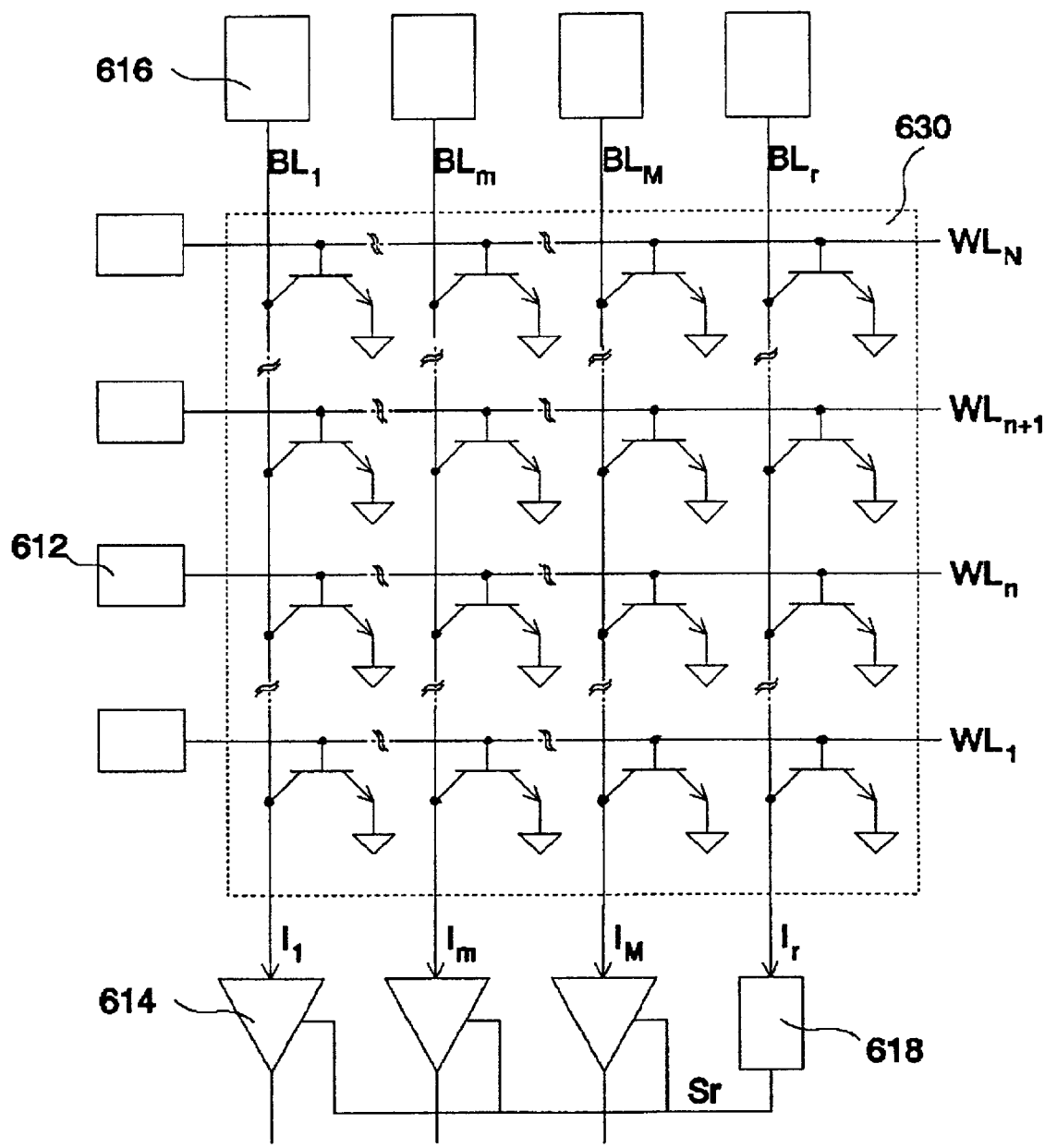
Figure 6D:
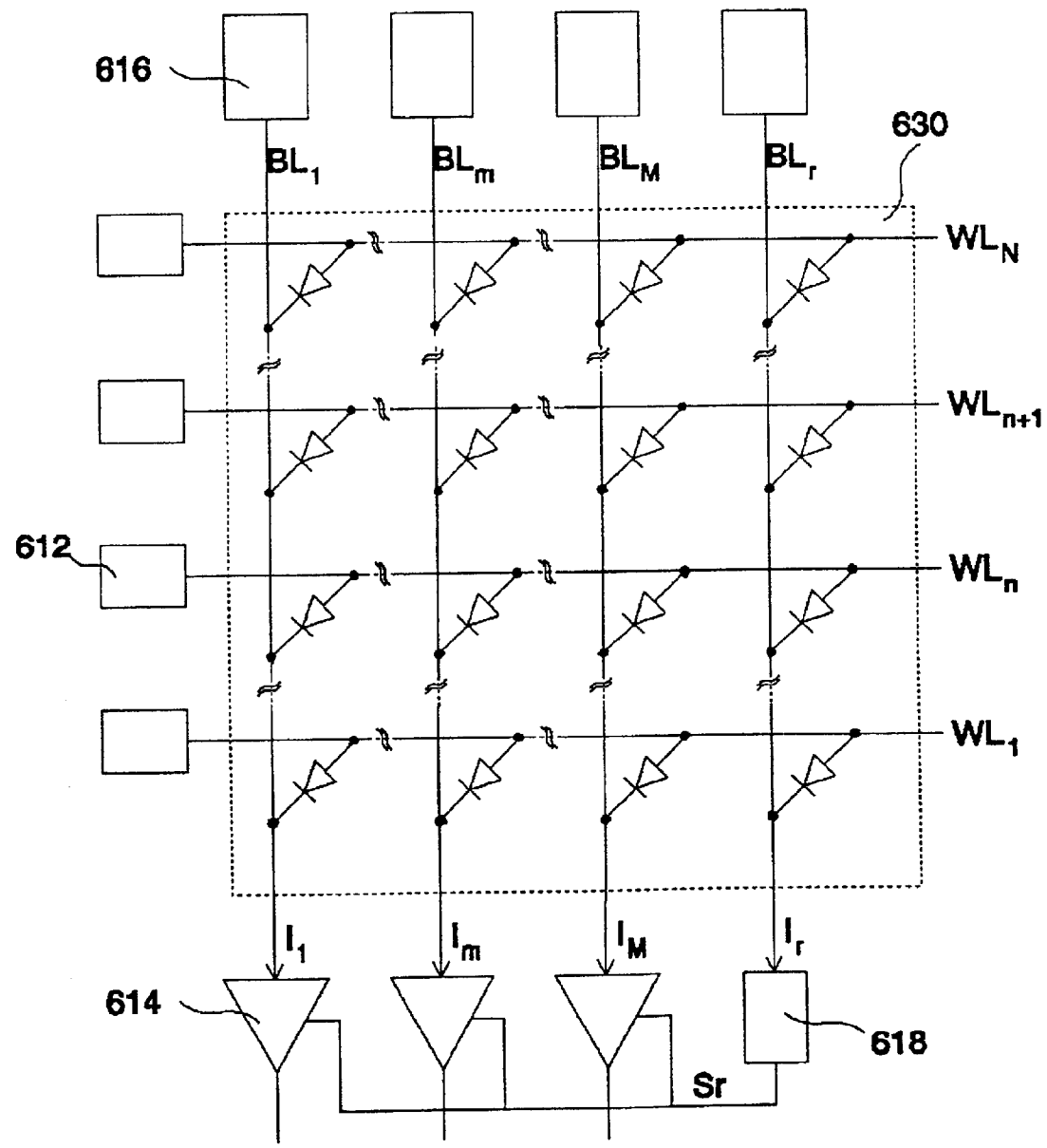

While specific embodiments of the invention have been illustrated and described herein, it is realized that other modifications and changes will occur to those skilled in the art. It should be understood that the above particular examples are for demonstration only and are not intended as limitation on the present invention. For example, the bit line sensor circuits in FIG. 6(b) senses the difference in transistor currents between two transistors experienced different levels of hot carrier damages. For a designer skilled in the art, there are infinite ways in designing the sensor circuits. The sensor can sense current, threshold voltage, transconductance, ... etc. Each bit line sensor circuit can have a multiplexer so that only a sub-set of the bit line currents are sensed. We also can have multiple levels of bit line sensor/amplifier circuits for a large SEPROM device. To achieve optimum reliability, we can have one reference transistor for every one data transistor. The size of the reference transistor can be different from the data transistors. There are also infinite ways in designing the stress circuits. There are infinite ways in the configuration of the SEPROM memory blocks. We also can have multiple levels of memory blocks for large SEPROM devices. Hot carrier effects are used in the above example, while one can use Vg stress or other types of electrical stresses to alter the properties of transistors to achieve the same purpose. In the above example we use MOS transistors as the stressed devices. We also can use other types of devices. FIG. 6(c) shows an example when bipolar transistors are used in the memory block, and FIG. 6(d) shows an example when diodes are used.

The SEPROM devices of the present invention have the following advantages:

The major advantage is that SEPROM can be manufactured by any IC technologies. They are ideal for embedded applications. Each data point is memorized by one transistor; it is therefore possible to store large number of data at very low cost. The data stored in SEPROM devices are not detectable by any physical analysis, and the devices appear identical to any other transistors; it is therefore ideal for security applications.

One potential disadvantage of SEPROM is that writing data to SEPROM can take longer time than writing to floating gate devices. This problem can be solved by many methods. For example, we can set the stress condition at maximum stress rate determined by existing data. Increasing stress voltages usually increase the stress rate exponentially. We also can reduce the channel length of the transistors to increase stress rate. Removing LDD will increase hot carrier effects significantly.

Another disadvantage is that SEPROM devices can not be re-programmed for many times because the stress damage is usually accumulative.

The stress damage can partially recover after initial programming. That is not a problem when the supporting sense circuit has enough margins. We also can refresh the data by writing the same data back into the SEPROM periodically.

Above all, SEPROM devices provide the possibility to support a wide variety of novel applications.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

I claim:

1. An EPROM device comprises a plurality of active circuit elements; and a stress means to apply electrical stresses to change an active performance characteristic of said active circuit elements and wherein said active circuit elements further comprising bipolar transistors.

2. The EPROM device of claim 1 further comprising:

a sensing means to sense a change of a current versus voltage variation ($\Delta i/\Delta v$) performance characteristic of said active circuit elements.

3. The EPROM device of claim 1 wherein:

said active circuit elements are MOS transistors.

4. The EPROM device of claim 1 further comprising:

dynamic random access memory (DRAM) cells disposed adjacent to said EPROM device.

5. The EPROM device of claim 1 wherein:

said active circuit elements are diodes.

6. The EPROM device of claim 1 wherein:

said active circuit elements further comprising transistors and said stress means is provided to cause hot carrier stress to cause a change of a drain-source current response characteristic to a gate-drain voltage of said active circuit elements.

7. The EPROM device of claim 1 wherein:

said active circuit elements further comprising transistors and said stress means is provided to apply high voltage to cause a change of a drain-source current response characteristic to a gate-drain voltage of said active circuit elements.

8. A stress effect programmable read only memory (SEPROM) device comprising:

a stress circuit having an electrically-stressed operational characteristic and a reference electric circuit having a reference operational characteristic; and a sense circuit for sensing a difference between said stress operational characteristic and said reference operational characteristic for detecting a data stored in said SEPROM.

9. The SEPROM of claim 8 wherein:

said stress circuit comprising an array of electrically-stressed transistors and said reference circuit comprising an array of reference transistors.

10. The SEPROM of claim 8 wherein:

said stress circuit comprising an array of electrically-stressed diodes and said reference circuit comprising an array of reference diodes.

11. The SEPROM of claim 8 wherein:

said stress circuit comprising an array of electrically-stressed bipolar transistors and said reference circuit comprising an array of reference bipolar transistors.

* * * * *